(12) United States Patent
Kim et al.

(10) Patent No.: US 8,786,584 B2
(45) Date of Patent: Jul. 22, 2014

(54) LIQUID CRYSTAL DISPLAY DEVICE HAVING OUTPUT TRANSISTOR HAVING LARGE CAPACITOR COMPONENT

(75) Inventors: Lee Young Kim, Seoul (KR); Bum Sik Kim, Suwon-si (KR); Hoe Woo Koo, Paju-si (KR)

(73) Assignee: LG Display Co. Ltd., Seoul (KR)

( * ) Notice: Subject to any disclaimer, the term of this patent is extended or adjusted under 35 U.S.C. 154(b) by 707 days.

(21) Appl. No.: 12/629,617

(22) Filed: Dec. 2, 2009

(65) Prior Publication Data

US 2010/0156862 A1 Jun. 24, 2010

(30) Foreign Application Priority Data

Dec. 22, 2008 (KR) ........................ 10-2008-0131090

(51) Int. Cl.
*G09G 3/36* (2006.01)

(52) U.S. Cl.
USPC ........................................................ 345/206

(58) Field of Classification Search
None
See application file for complete search history.

(56) References Cited

U.S. PATENT DOCUMENTS

| | | | |
|---|---|---|---|
| 4,623,908 A * | 11/1986 | Oshima et al. ................. 257/66 |
| 8,106,864 B2 * | 1/2012 | Moon et al. .................... 345/87 |
| 2002/0003964 A1 * | 1/2002 | Kanbara et al. ............... 396/661 |
| 2002/0113934 A1 * | 8/2002 | Aoki ............................. 349/149 |
| 2006/0061526 A1 * | 3/2006 | Shirasaki et al. ............... 345/77 |
| 2006/0220587 A1 | 10/2006 | Tobita et al. |
| 2008/0048934 A1 * | 2/2008 | Yamamoto et al. ............. 345/55 |
| 2008/0088555 A1 | 4/2008 | Shin et al. |
| 2008/0187089 A1 * | 8/2008 | Miyayama et al. ............. 377/79 |
| 2010/0033476 A1 * | 2/2010 | Yamamoto et al. ........... 345/214 |
| 2010/0231492 A1 * | 9/2010 | Moon et al. ...................... 345/87 |

FOREIGN PATENT DOCUMENTS

| | | | |
|---|---|---|---|
| CN | 1841565 A | 10/2006 | |
| JP | 11-190857 | 7/1999 | |
| JP | 11190857 A * | 7/1999 | ............. G02F 1/136 |
| KR | 10-2008-0033565 | 4/2008 | |

OTHER PUBLICATIONS

English machine translation of JP 11190857 A (Shimada, Active Matrix Substrate and Liquid Crystal Display Device, Jul. 1999).*
Office Action issued in corresponding Chinese Patent Application No. 200910226132.5, mailed Aug. 30, 2012.
Office Action issued in corresponding Chinese Patent Application No. 200910226132.5, mailed Mar. 28, 2013.
Search Report issued in corresponding Chinese Patent Application No. 2009102261325, mailed Mar. 28, 2013.

* cited by examiner

*Primary Examiner* — Wayne Young
*Assistant Examiner* — Mark Fischer
(74) *Attorney, Agent, or Firm* — Brinks Gilson & Lione

(57) ABSTRACT

The liquid crystal display device includes an output portion which is configured to include an output transistor having a large capacitor component. The output portion includes a top electrode which is configured to include an output transistor having a large capacitor component. As such, the liquid crystal display device can enhance the response speed of liquid crystal.

6 Claims, 5 Drawing Sheets

LIQUID CRYSTAL DISPLAY DEVICE HAVING OUTPUT TRANSISTOR HAVING LARGE CAPACITOR COMPONENT

CROSS-REFERENCE TO RELATED APPLICATION

This application claims priority under 35 U.S.C. 119 to Korean Patent Application No. 10-2008-0131090, filed on Dec. 22, 2008, which is hereby incorporated by reference in its entirety.

BACKGROUND

1. Field of the Disclosure

This disclosure relates to a liquid crystal display device adapted to improve the response time of liquid crystal.

2. Description of the Related Art

Nowadays, image display devices driving pixels arranged in an active matrix shape have been widely researched. The image display devices include liquid crystal display (LCD) devices, organic electro-luminescent display (OLED) devices, and so on.

More specifically, an LCD device applies data signals, corresponding to image information, to the pixels arranged in an active matrix shape and controls the transmissivity of the liquid crystal layer so that the desired image is displayed. To this end, an LCD device includes a liquid crystal panel with the pixels arranged in an active matrix shape, and a driving circuit for driving the liquid crystal panel.

In a liquid crystal panel, gate lines and data lines are arranged to cross each other. Pixel regions are defined by the gate lines and the data lines crossing. Each of the pixel regions includes a thin film transistor (TFT) and a pixel electrode connected to it. The TFT includes a gate electrode connected to the respective gate line, a source electrode connected to the respective data line, and a drain electrode connected to the respective pixel electrode.

The driving circuit includes a gate driver sequentially applying scan signals to the gate lines and a data driver applying data signals to the data lines. As the gate driver sequentially applies the scan signals to the gate lines, the pixels on the liquid crystal panel are selected in the line unit. Whenever the gate lines are sequentially selected in a single line, the data driver applies the data signals to the data lines. As such, the transmissivity of the liquid crystal layer is controlled by an electric field which is induced between the pixel electrode and a common electrode and corresponds to the data signal applied to each pixel. Accordingly, the LCD device displays an image.

In order to lower manufacturing cost, an LCD device of an internal driver type has recently been developed which includes the gate driver and the data driver provided on the liquid crystal panel. In an LCD device of an internal driver type, the gate driver is simultaneously manufactured with the thin film transistors when the thin film transistors are formed on the liquid crystal panel. Meanwhile, the data driver may or may not be provided on the liquid crystal panel.

As the size of an LCD device increases, the gate lines lengthen by the increment of screen size so that line resistances increase. This results in the response time of the liquid crystal becoming slower due to the lowered changing rate of the thin film transistor.

An output transistor, which is positioned at an output portion applying the gate signal to the respective gate line, must be connected to a plurality of thin film transistors. Due to this, the gate signal output from the output transistor is affected by parasitic capacities within the thin film transistors. As a result, the charging rate of the thin film transistor is lowered, and furthermore the response time of the liquid crystal is deteriorated.

SUMMARY

According to one general aspect of the present embodiment, an LCD device includes: a display panel configured to display an image and include a plurality of gate lines and a plurality of data lines arranged on it; a data driver configured to supply the data lines of the liquid crystal panel with data signals corresponding to the image; and a gate driver formed on the liquid crystal panel and configured to include a plurality of shift registers which are configured to apply output signals sequentially shifted from a start pulse to the gate lines. Each of the shift registers includes an output portion configured to include an output transistor, and a control portion controlling the output portion. The output transistor includes: a gate electrode responsive to a voltage on a first node; a source electrode receiving a clock signal; a drain electrode connected to the respective gate line and configured to apply the clock signal from the source electrode to the respective gate line according to the voltage on the first node; and a top electrode disposed on a uppermost layer and connected to the gate electrode.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
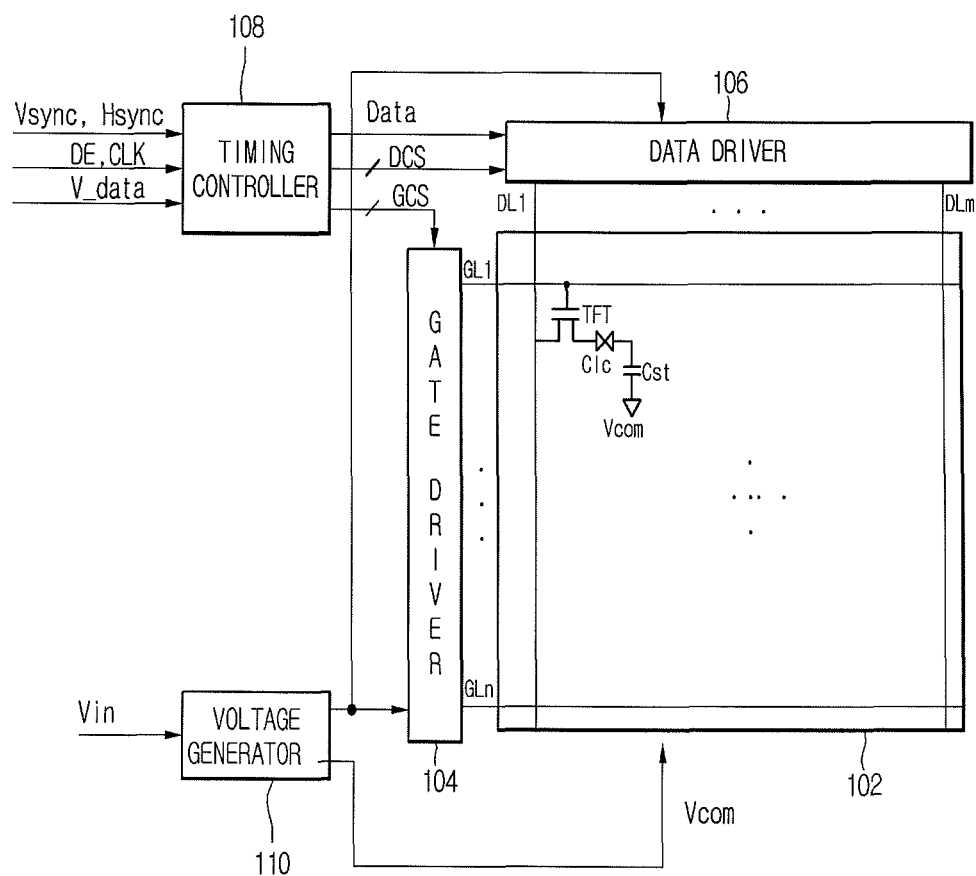
FIG. 1 is a schematic diagram showing an LCD device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIG. 1 is a schematic diagram showing an LCD device according to an embodiment of the present disclosure. Referring to FIG. 1, an LCD device according to an embodiment of the present disclosure includes a liquid crystal panel 102, a gate driver 104, a data driver 106, a timing controller 108, and a voltage generator 110. The liquid crystal panel 102 is configured to include a plurality of gate lines GL1~GLn and a plurality of data lines DL1~DLm arranged to display an image. The gate driver 104 is configured to drive the plural gate lines GL1~GLn. The data driver 106 is configured to drive the plural data lines DL1~DLm. The timing controller 108 is configured to control the driving timings of the gate and data drivers 104 and 106. The voltage generator 110 is configured to generate a common voltage Vcom to be applied to the liquid crystal panel 102.

The liquid crystal panel 102 includes pixels formed on unit regions which are defined by the plurality of gate lines GL1~GLn and the plurality of data lines DL1~DLm crossing each other. Each of the pixels is configured to include a thin film transistor TFT formed at the intersection of the respective gate line GL and the respective data line DL, and a liquid crystal cell Clc connected between the thin film transistor TFT and a common electrode Vcom. The thin film transistor TFT responds to a gate scan signal (or a gate signal, or a scan signal) on the respective gate line GL and switches a pixel data voltage (or a data voltage) which will be applied from the respective data line DL to the respective liquid crystal cell Clc.

The gate driver 104 responds to gate control signals GCS from the timing controller 108 and applies a plurality of gate scan signals to the plurality of gate lines GL1~GLn, respectively. The gate scan signals forces the plurality of gate lines GL1~GLn to be sequentially enabled in one horizontal synchronous signal period.

The data driver 106 responds to data control signals DCS from the timing controller 108 and generates a plurality of pixel data voltages whenever any one among the gate lines GL1~GLn is enabled. The plurality of pixel data voltages are applied to the plural data lines DL1~DLm, respectively. To this end, the data driver 106 inputs pixel data for pixels on one line from the timing controller 108. Also, the data driver 106 converts the one line pixel data into the analog pixel data voltages using a set of gamma voltages.

The timing controller 108 derives the gate control signals GCS and the data control signals DCS from synchronous signals Vsync and Hsync, a data enable signal DE, and a clock signal CLK which are applied from an external system (for example, the graphic module of a computer system or the image demodulator of a television which are not shown). The gate control signal are used in the control of the gate driver 104, and the data control signals DCS are used in the control of the data driver 106. Likewise, the timing controller 108 rearranges data of frame unit V_data from the external system and applies the rearranged data Data to the data driver 106.

The voltage generator 110 derives driving voltages and a common voltage from an input voltage which is applied from an external voltage source (not shown). The driving voltages are used for driving the gate and data drivers 104 and 106. The common voltage Vcom is applied to the common electrode which is formed on the liquid crystal panel 102.

Figure 2:
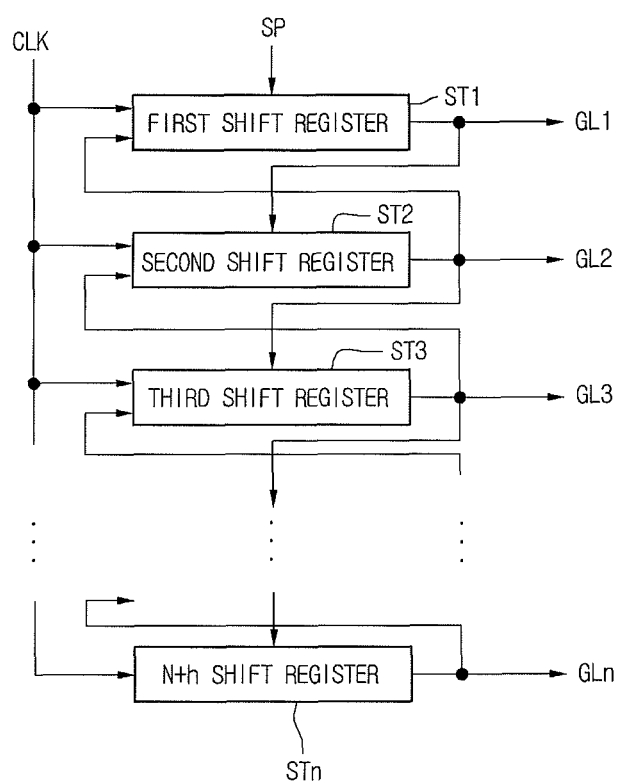
FIG. 2 is a detailed diagram showing the gate driver in FIG. 1.

FIG. 2 is a detailed diagram showing the gate driver in FIG. 1. As shown in FIGS. 1 and 2, the gate driver 104 is configured to include a plurality of shift registers ST1~STn opposite to a plurality of gate lines GL1~GLn.

Each of the shift registers ST1~STn is connected to an input line for a clock signal CLK, the output terminal of a shift register ST positioned at the next stage thereof, and the output terminal of another shift register ST positioned at the previous stage thereof. For example, the first shift register ST1 is connected to the input line for the clock signal CLK, the output terminal of a second shift register ST2, and an input line for a start pulse SP.

Figure 3:
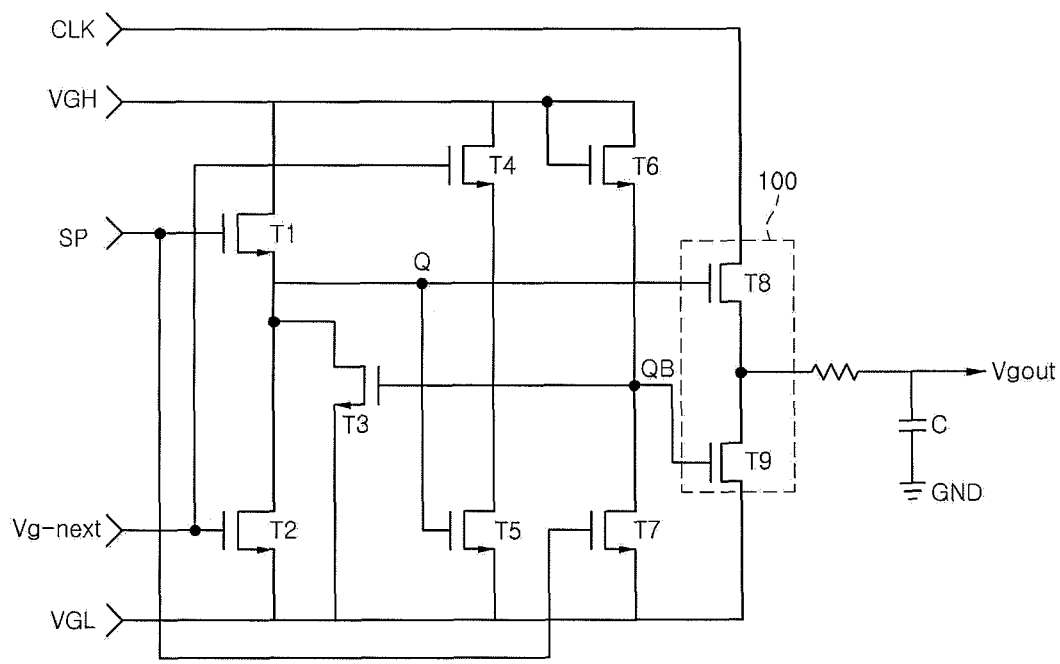
FIG. 3 is a circuit diagram showing the detailed circuit configuration of the first shift register in FIG. 2.

FIG. 3 is a circuit diagram showing the detailed circuit configuration of the first shift register in FIG. 2. As shown in FIG. 3, the first shift register ST1 inputs the start pulse SP, the clock signal CLK, and an output signal from the second shift register ST2 corresponding to the next stage thereof. A gate high voltage VGH and a gate low voltage VGL are applied to the first shift register ST1. Also, the first shift register ST1 consists of a control portion including first to seventh transistors T1~T7 and an output portion including eight and ninth transistors T8 and T9.

The control portion of the first shift register ST1 includes: the first transistor T1 which responds to the start pulse SP and is connected between the input line for the gate high voltage VGH and a first node Q; the second transistor T2 which responds to an output signal of the second shift register ST2 and is connected between the first node Q and the input line for gate low voltage VGL; and a third transistor T3 which responds to a voltage from a second node QB and is connected between a drain electrode of the first transistor T1 and the input line for the gate low voltage VGL.

The control portion of the first shift register ST1 further includes: the fourth transistor T4 which responds to the output signal of the second shift register ST2 and is connected between the input line of the gate high voltage VGH and a source electrode of the fifth transistor T5; and the fifth transistor T5 which responds to the voltage on the first node Q and is connected between a drain electrode of the fourth transistor T4 and the input line for the gate low voltage VGL.

Furthermore, the control portion of the first shift register ST1 includes: the sixth transistor T6 which responds to the gate high voltage VGH and is connected between the input line of the gate high voltage VGH and the second node QB; and the seventh transistor T7 which responds to the start pulse SP and is connected between the second node QB and the input line of the gate low voltage VGL.

The output portion 100 of the first shift register ST1 includes: the eighth transistor T8 which selectively applies the clock signal CLK to the first gate line GL1 opposite to the first shift register ST1 according to the voltage on the first node Q; and the ninth transistor T9 which selectively discharges the voltage on the first gate line GL1 according to the voltage on the second node QB.

The eighth transistor T8 includes a gate electrode connected to the first node Q, a source electrode connected to the input line for the clock signal CLK, a drain electrode connected to the first gate line GL1, and a top electrode (not shown) connected to the gate electrode.

Similarly, the ninth transistor T9 includes a gate electrode connected to the second node QB, a source electrode connected to the first gate line GL1, a drain electrode connected to the input line for the gate low voltage VGL, and a top electrode (not shown) connected to the gate electrode.

Figure 4:
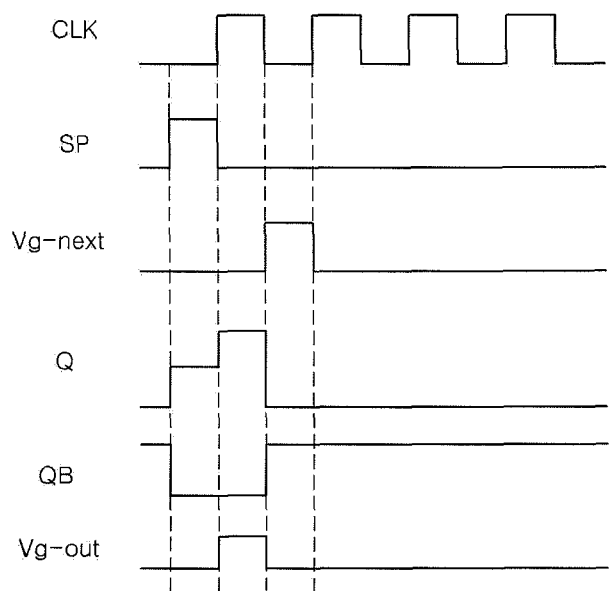
FIG. 4 is a waveform diagram showing drive signals applied to the first shift register of FIG. 3.

FIG. 4 is a waveform diagram showing drive signals applied to the first shift register of FIG. 3. As shown in FIGS. 3 and 4, the first shift register ST1 inputs the clock signal CLK of a fixed period, a start pulse SP, and an output signal Vg-next of the second shift register ST2. The clock signal CLK includes alternate low and high state pulses. The start pulse SP has a falling time synchronized with the rising time of the first high state pulse of the clock signal CLK. The output signal Vg-next of the second shift register ST2 has a high state pulse synchronized with a first low state pulse of the clock signal CLK.

In the first interval during which the start pulse SP of the high state is applied to the first shift register ST1, the first transistor T1 of the first shift register ST1 is turned-on so that the gate high voltage VGH is applied to the first node Q via the source and drain electrodes of the first transistor T1. At the same time, the seventh transistor T7 is also turned-on by the start pulse SP of the high state, thereby allowing the gate low voltage VGL on the gate low voltage input line VGL to be applied to the second node QB.

During the second interval, the start pulse SP goes to a low state and the clock signal CLK of a high state is applied to the first shift register ST1. Then, the eighth transistor T8 is turned-on.

More specifically, the eighth transistor T8 is turned-on by means of the gate high voltage VGH charged in the first node Q during the second interval. The voltage charging of the first node Q is already performed during the first interval. When the clock signal CLK goes to a high state, a bootstrapping phenomenon occurs by means of an internal capacitor component Cgs formed between the gate electrodes and source electrode of the eighth transistor T8, so that the voltage on the first node Q rises to about two times that of the gate high voltage VGH and ensures a high state. As such, the eighth transistor T8 is sufficiently turned-on and applies the clock signal CLK of the high state to the first gate line GL1 as an output signal Vgout of the first shift register ST1.

In this manner, the output signal Vgout corresponding to the gate high voltage VGH is applied to the first gate line GL1 as the eighth transistor T8 is sufficiently turned-on.

Sequentially, the first shift register ST1 inputs the clock signal CLK of the low state and receives the output signal Vg-next of the high state from the second shift register ST2 next to the first shift register ST1, during a third interval. At this time, the sixth transistor T6 is turned-on so that the gate high voltage VGH is charged in the second node QB. As such, the ninth transistor T9 responding to the voltage on the second node QB is turned-on, thereby enabling the gate low voltage VGL to be applied to the first gate line GL1, which is connected to the first shift register ST1, via the ninth transistor T9. In other words, the first gate line GL1 charges the gate low voltage VGL during the third interval.

On the other hand, as the gate high voltage VGH is charged in the second node QB, the third transistor T3 connected to the second node QB is turned-on. In accordance therewith, the voltage charged in the first node Q changes into the gate low voltage VGL from the gate low voltage input line VGL.

In this way, since the gate low voltage VGL and the gate high voltage VGH are applied to the first and second nodes Q and QB of the first shift register ST1, respectively, the first gate line GL1 is charged by the gate low voltage VGL passing through the ninth transistor T9, during the third interval.

As described above, each of the eighth and ninth transistors T8 and T9 includes the gate and top electrodes and has a fast charging/discharging time in comparison with the related art transistor having only the gate electrode.

Figure 5:
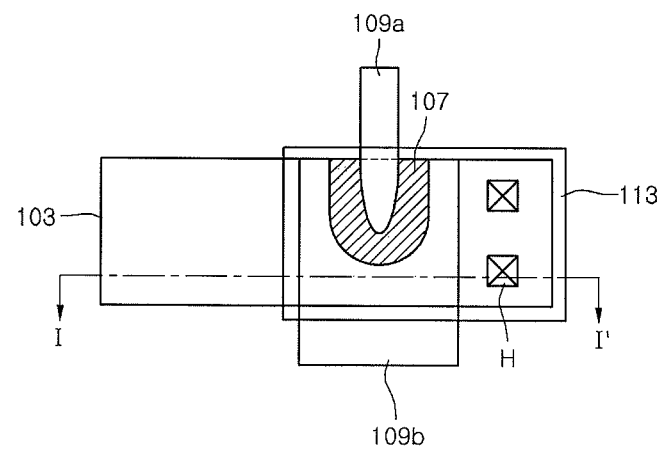
FIG. 5 is a planar view schematically showing the eighth transistor included in FIG. 3.
Figure 6:
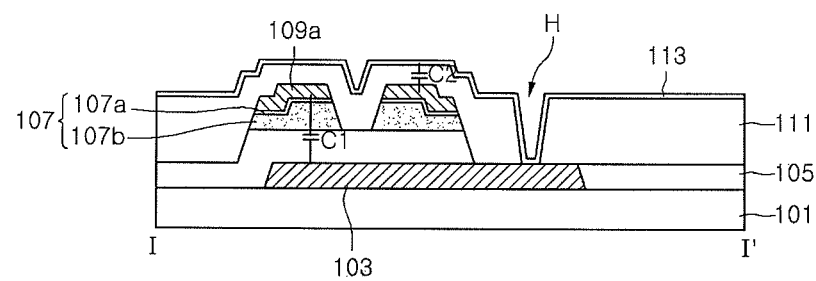
FIG. 6 is a cross-sectional view showing the eighth transistor taken along the line I-I' shown in FIG. 5.

FIG. 5 is a planar view schematically showing the eighth transistor included in FIG. 3. FIG. 6 is a cross-sectional view showing the eighth transistor taken along the line I-I' shown in FIG. 5.

As shown in FIGS. 5 and 6, the eighth transistor T8 includes: the gate electrode 103 formed on a substrate 101; a gate insulating film 105 formed on the substrate 101 having the gate electrode 103; a semiconductor layer 107 formed on the substrate 101, opposite to the gate electrode 103, having the gate insulating film 105; the source and drain electrodes 109a and 109b being separate from each other on the substrate 101 having the semiconductor layer 107; and a passivation layer (or a protective layer) 111 formed on the entire surface of the substrate 101 having the source and drain electrodes 109a and 109b. The eighth transistor T8 further includes the top electrode 113 connected to the gate electrode 103 formed on the substrate 101 through a contact hole H.

The semiconductor layer 107 is configured to include an active layer 107a formed from amorphous silicon, and an ohmic contact layer 107b formed from impurity-doped amorphous silicon. The gate insulating film 105 can be formed by depositing an organic material including Benzocyclobutene BCB, an acryl-based resin, and others.

The contact hole H formed on the substrate 101 with the passivation layer 111 thereon partially exposes the gate electrode 103. In other words, the contact hole H for partially exposing the gate electrode 103 is formed in the passivation layer 111.

The top electrode 113 is provided by forming a conductive metal film on the substrate 101 which includes the passivation layer 111 with the contact hole H. The conductive metal film is formed to cover the entire surface of the substrate 101 and to be connected to the partially exposed gate electrode 103 via the contact hole H. The top electrode 113 can be formed of the same material as the pixel electrode formed on the pixel region of the liquid crystal panel (102 in FIG. 1). In other words, the top electrode 113 can be formed from a transparent metal material such as indium-tin-oxide. Alternatively, the top electrode 113 can be formed of the same metal material as the source/drain electrodes 109a and 109b or the gate insulating electrode 103. Moreover, the top electrode 113 can be patterned in the size of the semiconductor layer 107.

Such an eighth transistor T8 may include a first capacitor component C1 generated between the gate electrode 103 and the source/drain electrode 109a and 109b, and a second capacitor component C2 generated between the source/drain electrodes 109a and 109b and the top electrode. Therefore, a boosted voltage in the first node Q connected to the gate electrode 103 of the eighth transistor T8 depends on the following equation 1.

$$V_Q((C_{drain}+C_{source})/(C_x+C_{drain}+C_{source}))\times V_{CLK} \quad \text{[Equation 1]}$$

In the equation 1, "Cdrain" and "Csource" correspond to capacitor components within the eighth transistor T8, and "Cx" means a parasitic capacitor component generated between other transistors (i.e., thin film transistors TFT) connected to the eighth transistor T8, and "$V_{CLK}$" means a high voltage of the clock signal.

In accordance with this equation 1, the boosted voltage $V_Q$ on the first node Q can be improved by increasing the capacitor component within the eighth transistor T8 or by decreasing the parasitic capacitor component between other transistors (i.e., the thin film transistors TFT). If the boosted voltage $V_Q$ on the first node Q is improved, the response time of the eighth transistor T8 can be enhanced.

The present embodiment will increase the capacitor component within the eighth transistor T8 rather than that between other transistors (i.e., the thin film transistors TFT) which are connected to the eighth transistor T8, in order to improve the boosted voltage $V_Q$ (or the boosting characteristic) on the first node Q.

Actually, the second capacitor component C2 is additionally provided to the eighth transistor T8 because the eighth transistor T8 is configured to include the top electrode 113 electrically connected to the gate electrode 103. The second capacitor component C2 added to the eighth transistor T8 improves the boosted voltage $V_Q$ on the first node Q.

Furthermore, the improvement of the boosted voltage $V_Q$ on the first node Q induces the response time of the eighth transistor T8 to be enhanced. The enhanced response time of the eighth transistor T8 enables the output signal of the eighth transistor T8 to be more rapidly applied to the gate lines GL1~GLn which are arranged on the liquid crystal panel 102. As such, the turned-on/off time of the thin film transistor TFT electrically connected to the gate line GL also becomes more rapid. As a result, the response time of liquid crystal is enhanced.

Figure 7:
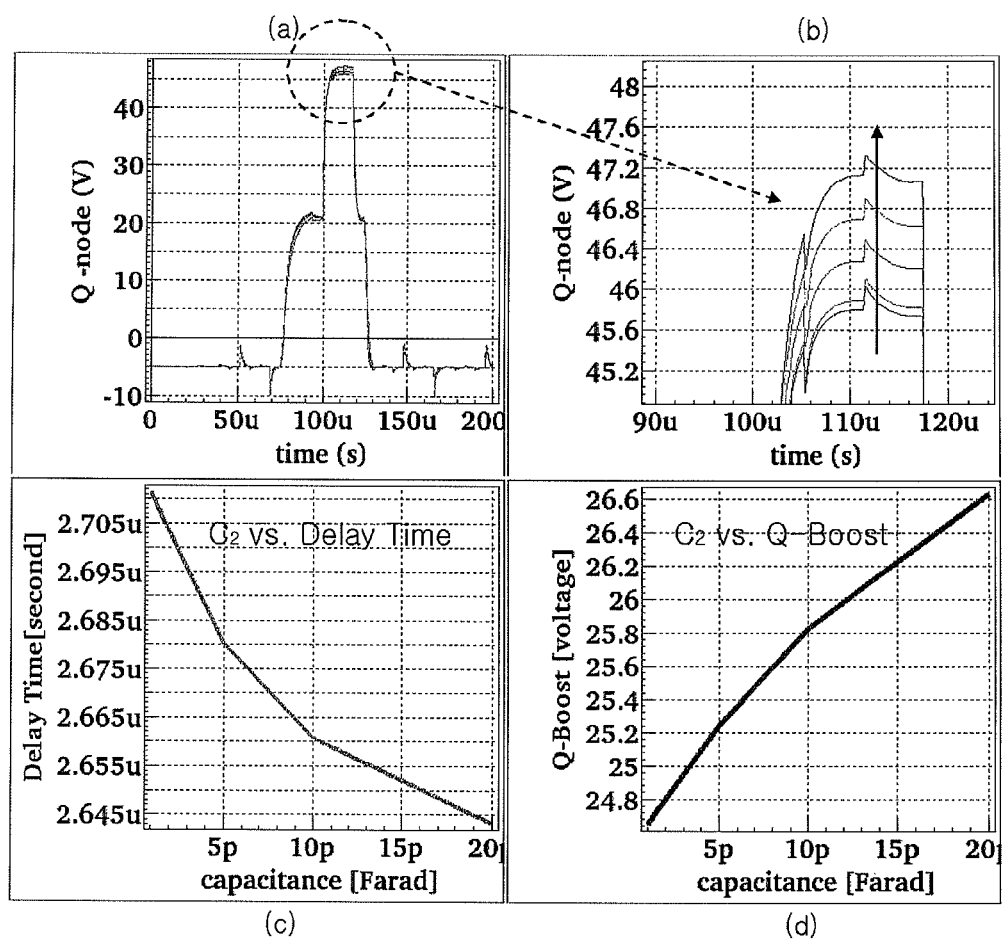
FIG. 7A is a graphic diagram representing the boost characteristic of a first node Q along with the capacitance increment of a second capacitor component C2 generated in the eighth transistor.
FIG. 7B is an enlarged graphic diagram representing a dot-line portion of FIG. 7A.
FIG. 7C is a graphic diagram representing the delay time generated in an output stage along with the capacitance increment of a second capacitor component C2.
FIG. 7D is a graphic diagram representing the boost characteristic of the first node Q along with the capacitance increment of a second capacitor component C2.

FIG. 7 includes graphic diagrams representing the boosted voltage of a first node Q along with the capacitance increment of a capacitor component generated in the eighth transistor. More specifically, FIG. 7A is a graphic diagram representing the boosted voltage of a first node Q along with the capacitance increment of a second capacitor component C2 generated in the eighth transistor, FIG. 7B is an enlarged graphic diagram representing a dot-line portion of FIG. 7A, FIG. 7C is a graphic diagram representing the delay time generated in an output stage along with the capacitance increment of a second capacitor component C2; and FIG. 7D is a graphic diagram representing the boost characteristic of the first node Q along with the capacitance increment of a second capacitor component C2.

As seen in FIGS. 7A and 7B, it is evident that the boosted voltage is improved as the capacitance of the second capacitor component C2 with the eighth transistor T2 increases. Also, the response time of the eighth transistor gradually becomes faster according to the capacitance increment of the second capacitor component C2 generated in the eighth transistor T8, as shown in FIG. 7C. In other words, a delay time in the eighth transistor T8 is reduced according to the capacitance increment of the second capacitor component C2. Furthermore, FIG. 7D is evident that the boosted voltage on the first node Q is improved according the capacitance increment of the second capacitor component C2 generated in the eighth transistor T2.

As described above, the LCD device according to an embodiment of the present disclosure enables an output portion for the gate scan signal to be configured to include an output transistor with the top electrode connected to the gate electrode, so that the boosted voltage on the first node Q is improved. The improvement of the boosted voltage on the first node Q induces the response time of the output transistor to be enhanced. The enhanced response time of the output transistor enables the output signal of the output transistor to be more rapidly applied to the gate lines GL1~GLn which are arranged on the liquid crystal panel. As such, the turned-on/off time of the thin film transistor TFT electrically connected to the gate line GL in a pixel region also becomes more rapid. As a result, the response time of liquid crystal on a pixel region is enhanced.

Consequently, the LCD device according to an embodiment of the present disclosure forces an output portion outputting the gate scan signal to include an output transistor with an additional electrode which is electrically connected to the gate electrode and positioned at the uppermost layer. As such, the performance of the output transistor can be improved, and the gate scan signal can be rapidly applied to the gate line. Therefore, the LCD device can enhance the response speed of liquid crystal.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A liquid crystal display device comprising:
a display panel configured to display an image and include a plurality of gate lines and a plurality of data lines arranged on it;
a data driver configured to supply the data lines of the display panel with data signals corresponding to the image; and
a gate driver disposed on the display panel and configured to include a plurality of shift registers which are configured to apply output signals sequentially shifted from a start pulse to the gate lines, each of the shift registers including a control portion having first to seventh transistors and an output portion having eighth and ninth transistors:
wherein the control portion includes the first transistor which responds to the start pulse and is connected between an input line for a gate high voltage and a first node; the second transistor which responds to the output signal and is connected between the first node and an input line for gate low voltage; the third transistor which responds to a voltage from a second node and is connected between a drain electrode of the first transistor and the input line for the gate low voltage; the fourth transistor which responds to the output signal and is connected between the input line of the gate high voltage and a source electrode of the fifth transistor; the fifth transistor which responds to the voltage on the first node and is connected between a drain electrode of the fourth transistor and the input line for the gate low voltage; the sixth transistor which responds to the gate high voltage and is connected between the input line of the gate high voltage and the second node; and the seventh transistor which responds to the start pulse and is connected between the second node and the input line of the gate low voltage,
wherein the output portion includes: the eighth transistor which selectively applies a clock signal to the gate line according to the voltage on the first node; and the ninth transistor which selectively discharges the voltage on the gate line according to the voltage on the second node,
wherein the eighth transistor includes:

a gate electrode responsive to a voltage on the first node;
a source electrode receiving the clock signal;
a drain electrode connected to the respective gate line and configured to apply the clock signal from the source electrode of the eighth transistor to the respective gate line according to the voltage on the first node;
a semiconductor layer disposed opposite the gate electrode;
a passivation layer disposed on the source and drain electrodes of the eighth transistor;
a top electrode disposed on the passivation layer and electrically connected to the gate electrode through a contact hole through the passivation layer, and
a control portion controlling the output portion,
wherein a first capacitor component is generated between the gate electrode and one of the source electrode of the eighth transistor and the drain electrode of the eighth transistor, and
wherein a second capacitor component is generated between the top electrode and one of the source electrode of the eighth transistor and the drain electrode of the eighth transistor.

2. The liquid crystal display device claimed as claim 1, wherein the eighth transistor includes:
   the gate electrode disposed on a substrate;
   a gate insulating film disposed on the substrate with the gate electrode;
   the semiconductor layer disposed on the substrate with the gate insulating film;
of the eighth transistor being separated from each other on the semiconductor layer.

3. The liquid crystal display device claimed as claim 1, wherein the top electrode is formed from a transparent metal material.

4. The liquid crystal display device claimed as claim 1, wherein the top electrode is formed from indium-tin-oxide.

5. The liquid crystal display device claimed as claim 1, wherein the top electrode is formed from the same metal material as the gate electrode.

6. The liquid crystal display device claimed as claim 1, wherein the top electrode is formed from the same metal material as the source and drain electrodes of the eighth transistor.

* * * * *